(12) United States Patent
Huang et al.

(10) Patent No.: US 10,464,808 B2
(45) Date of Patent: Nov. 5, 2019

(54) SEMICONDUCTOR ARRANGEMENT AND FORMATION THEREOF

(71) Applicant: TAIWAN SEMICONDUCTOR MANUFACTURING COMPANY LIMITED, Hsin-Chu (TW)

(72) Inventors: Hsin-Ting Huang, Bade (TW); Hsiang-Fu Chen, Zhubei (TW); Wen-Chuan Tai, Hsinchu (TW); Chia-Ming Hung, Taipei (TW); Shao-Chi Yu, Hsinchu (TW); Hung-Hua Lin, Taipei (TW); Yuan-Chih Hsieh, Hsinchu (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 58 days.

(21) Appl. No.: 15/722,199

(22) Filed: Oct. 2, 2017

(65) Prior Publication Data

US 2018/0022602 A1 Jan. 25, 2018

Related U.S. Application Data

(62) Division of application No. 14/190,138, filed on Feb. 26, 2014, now Pat. No. 9,776,858.

(51) Int. Cl.
*B81C 1/00* (2006.01)
*H01L 23/48* (2006.01)

(52) U.S. Cl.
CPC ...... *B81C 1/00301* (2013.01); *B81B 2207/07* (2013.01); *B81C 1/00269* (2013.01);
(Continued)

(58) Field of Classification Search
CPC ........... H01L 21/768; H01L 21/823475; H01L 21/823871; H01L 23/48; H01L 23/481;
(Continued)

(56) References Cited

U.S. PATENT DOCUMENTS 7,045,868 B2 * 5/2006 Ding .................. B81B 7/007
257/414
8,486,749 B2 * 7/2013 Lin .................... B82Y 10/00
136/255

(Continued)

OTHER PUBLICATIONS

Corresponding Taiwan Patent Application Office Action dated Jun. 15, 2017 (5 pgs).

*Primary Examiner* — David C Spalla
(74) *Attorney, Agent, or Firm* — Cooper Legal Group, LLC

(57) ABSTRACT

A semiconductor arrangement and method of formation are provided. The semiconductor arrangement includes a MEMS device in a MEMS area, where a first metal layer is connected to a first metal connect adjacent the MEMS area and a cap is over the MEMS area to vacuum seal the MEMS area. A first wafer portion is over and bonded to the first metal layer which connects the first metal connect to a first I/O port using metal routing. The first metal layer and the first wafer portion bond requires 10% less bonding area than a bond not including the first metal layer. The semiconductor arrangement including the first metal layer has increased conductivity and requires less processing than an arrangement that requires a dopant implant to connect a first metal connect to a first I/O port and has a better vacuum seal due to a reduction in outgassing.

20 Claims, 5 Drawing Sheets

(52) U.S. Cl.
CPC ............ *H01L 23/48* (2013.01); *H01L 23/481* (2013.01); *H01L 2924/1461* (2013.01)

(58) Field of Classification Search
CPC ... H01L 23/52; H01L 23/522; H01L 23/5226; H01L 23/528; H01L 23/535; H01L 23/538; B81C 1/00301; B81B 227/07
See application file for complete search history.

(56) References Cited

U.S. PATENT DOCUMENTS

| | | | |
|---|---|---|---|
| 10,040,681 B2* | 8/2018 | Wu | B81C 1/00246 |
| 2004/0067604 A1 | 4/2004 | Ouellet et al. | |
| 2009/0085191 A1 | 4/2009 | Najafi et al. | |
| 2010/0148341 A1* | 6/2010 | Fuji | B81B 7/007 |
| | | | 257/686 |
| 2012/0091342 A1 | 4/2012 | Berger et al. | |
| 2012/0248615 A1 | 10/2012 | Chien et al. | |
| 2013/0168740 A1* | 7/2013 | Chen | B81C 1/00238 |
| | | | 257/254 |
| 2014/0264474 A1* | 9/2014 | Chu | B81C 1/00238 |
| | | | 257/254 |

\* cited by examiner

SEMICONDUCTOR ARRANGEMENT AND FORMATION THEREOF

RELATED APPLICATIONS

This application is a divisional of and claims priority to U.S. patent application Ser. No. 14/190,138, titled "SEMICONDUCTOR ARRANGEMENT AND FORMATION THEREOF" and filed on Feb. 26, 2014, which is incorporated herein by reference.

BACKGROUND

A semiconductor arrangement comprises one or more micro-electro-mechanical system (MEMS) devices. In a MEMS device, such as a pressure sensor, generally at least two of sensing, processing or actuating functions are combined on a single microchip.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
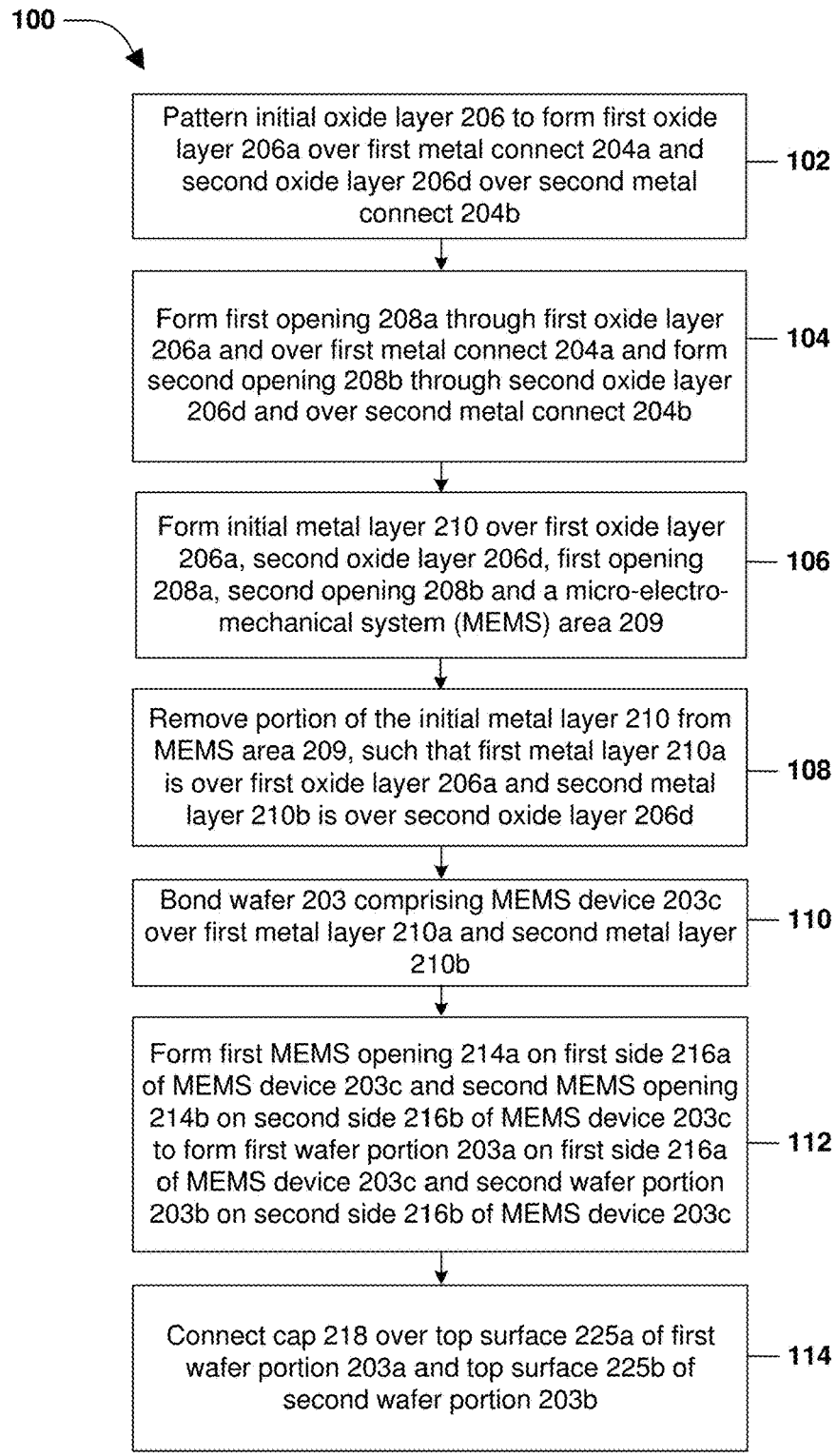
FIG. 1 is a flow diagram illustrating a method of forming a semiconductor arrangement, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more techniques for forming a semiconductor arrangement and resulting structures formed thereby are provided herein.

Figure 2:
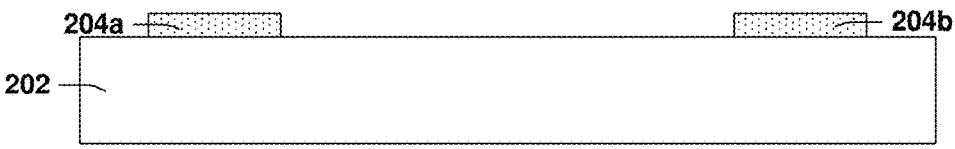
FIG. 2 is an illustration of a semiconductor arrangement, in accordance with some embodiments.
Figure 3:
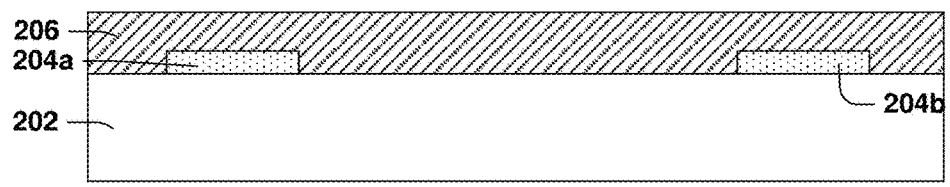
FIG. 3 is an illustration of a semiconductor arrangement, in accordance with some embodiments.
Figure 4:
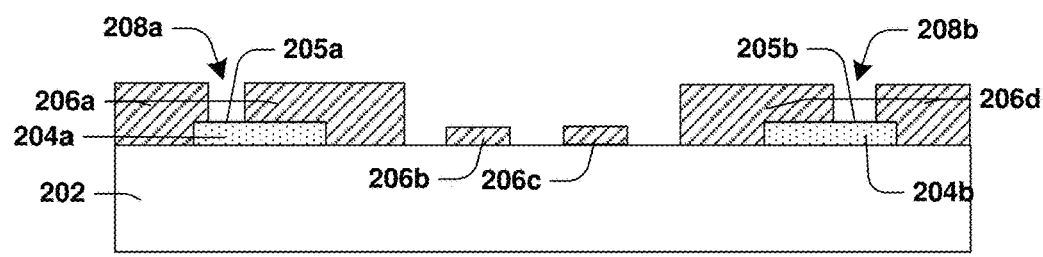
FIG. 4 is an illustration of a semiconductor arrangement, in accordance with some embodiments.
Figure 7:
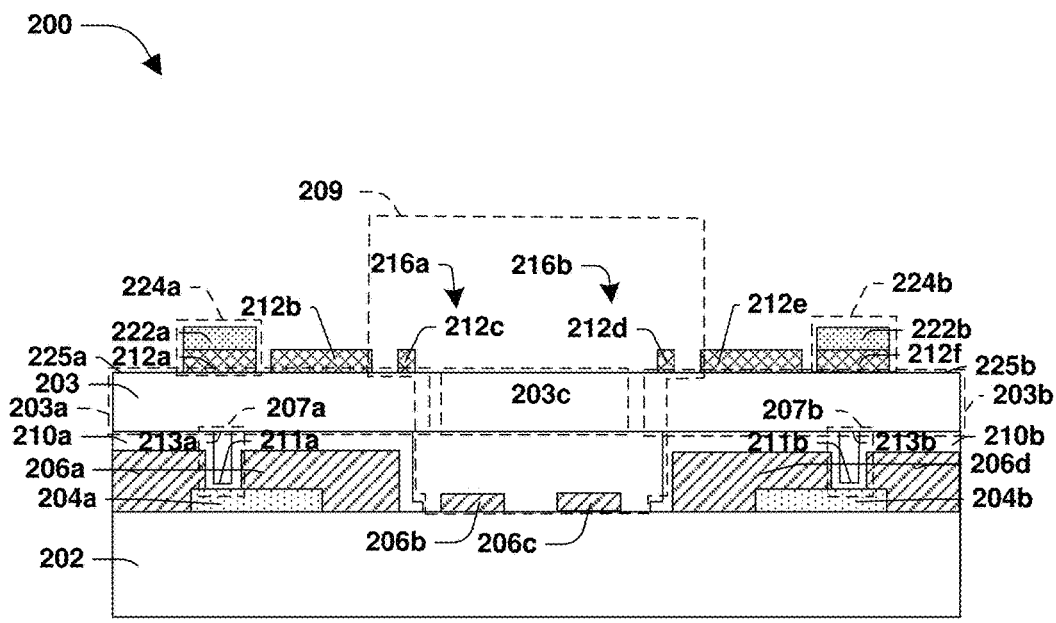
FIG. 7 is an illustration of a semiconductor arrangement, in accordance with some embodiments.
Figure 8:
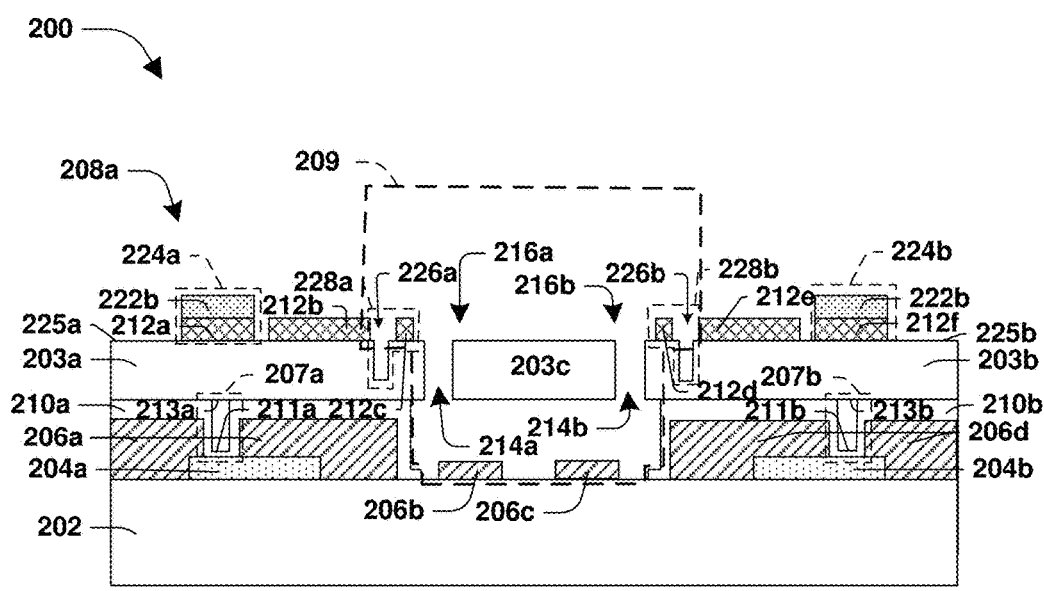
FIG. 8 is an illustration of a semiconductor arrangement, in accordance with some embodiments.
Figure 9:
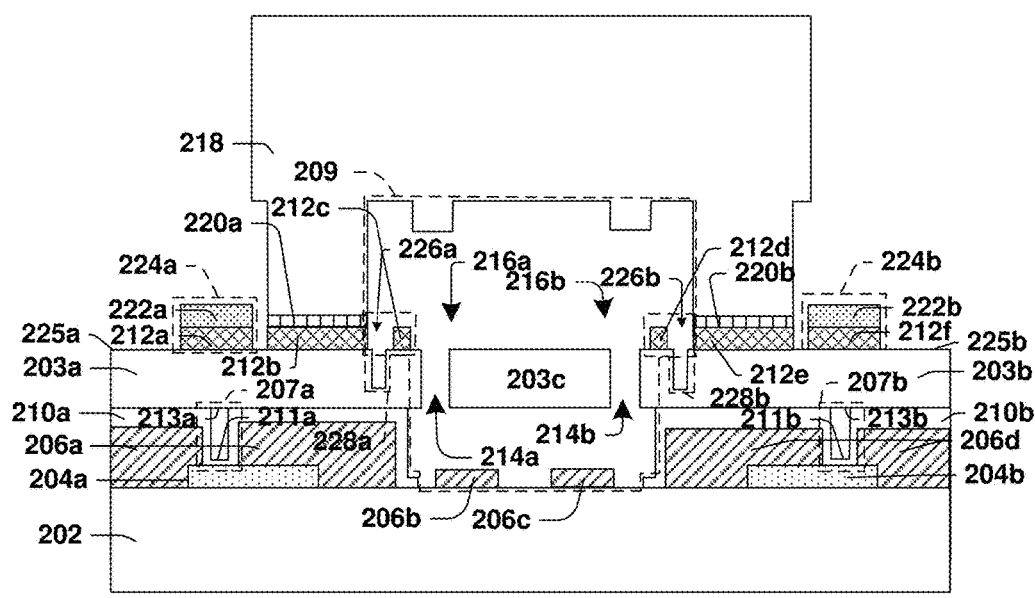
FIG. 9 is an illustration of a semiconductor arrangement, in accordance with some embodiments.

A method 100 of forming a semiconductor arrangement 200 according to some embodiments is illustrated in FIG. 1 and one or more structures formed thereby at various stages of fabrication are illustrated in FIGS. 2-9. According to some embodiments, such as illustrated in FIG. 9, the semiconductor arrangement 200 comprises a first metal connect 204a adjacent a second metal connect 204b on a substrate 202. In some embodiments, a first oxide layer 206a is over the first metal connect 204a and a second oxide layer 206d is over the second metal connect 204b. In some embodiments, a first metal layer 210a is over the first oxide layer 206a, such that a portion 207a of the first metal layer 210a is in contact with a top surface 205a of the first metal connect 204a, as illustrated in FIG. 4. In some embodiments, a second metal layer 210b is over the second oxide layer 206d, such that a portion 207b of the second metal layer 210b is in contact with a top surface 205b of the second metal connect 204b, as illustrated in FIG. 4. In some embodiments, the first metal layer 210a and the second metal layer 210b comprise titanium. In some embodiments, a micro-electro-mechanical system (MEMS) area 209 is between the first metal layer 210a and the second metal layer 210b, as illustrated in FIG. 9. In some embodiments, the MEMS area 209 comprises a MEMS device 203c. In some embodiments, a first wafer portion 203a comprising silicon is bonded to the first metal layer 210a by a titanium silicon bond and a second wafer portion 203b comprising silicon is bonded to the second metal layer 210b by a titanium silicon bond. In some embodiments, a cap 218 is connected over a top surface 225a of the first wafer portion 203a by a first bond and connected over a top surface 225b of the second wafer portion 203b by a second bond. In some embodiments, the first bond comprises a first eutectic bond between a first bonding pad 212b and a first cap bonding pad 220a of the cap 218. In some embodiments, the first bonding pad 212b is on the top surface 225a of the first wafer portion 203a and comprises at least one of aluminum or copper. In some embodiments, the first cap bonding pad 220a comprises germanium. In some embodiments, the second bond comprises a second eutectic bond between a second bonding pad 212e and a second cap bonding pad 220b of the cap 218. In some embodiments, the second bonding pad 212e is on the top surface 225b of the second wafer portion 203b and comprises at least one of aluminum or copper. In some embodiments, the second cap bonding pad 220b comprises germanium. In some embodiments, connecting the cap 218 vacuum seals the MEMS area 209, and thus the MEMS device 203c therein. In some embodiments, a first I/O port 224a comprises a first glue pad 222a comprising at least one of titanium or nitride over a first metal pad 212a comprising at least one of aluminum or copper, the first metal pad 212a on the top surface 225a of the first wafer portion 203a adjacent the cap 218 outside of the MEMS area 209. In some embodiments, a second I/O port 224b comprises a second glue pad 222b comprising at least one of titanium or nitride over a second metal pad 212f comprising at least one of aluminum or copper, the second metal pad 212f on the top surface 225b of the second wafer portion 203b adjacent the cap 218 outside of the MEMS area 209. In some embodiments, at least one of a first metal routing (not shown) connects the first metal layer 210a to the first I/O port 224a or second metal routing (not shown) connects the second metal layer 210b to the second I/O port 224b. In some embodiments, the bond between the first metal layer 210a and the first wafer portion 203a requires between about 5% to about 10% less bonding area than a bond that is not between a first metal layer and a first wafer portion. In some embodiments, the first metal layer 210a and the second metal layer 210b increase the conductivity of the semiconductor arrangement 200, as compared to an arrangement that lacks at least one of a first metal layer or a second metal layer. In some embodiments, the semiconductor arrangement 200 comprising the first metal layer 210a connecting via a first metal routing the first metal connect 204a to the first I/O port 224a requires less processing than a device that requires a dopant implant to connect a first metal connect to a first I/O port. Further, a semiconductor device that does not require a dopant implant to connect a first metal connect to a first I/O port has at least one of an enhanced first bond or an enhanced second bond and thus a greater vacuum seal, due to a reduction in outgassing as compared to a semiconductor arrangement that requires the dopant implant.

At 102, an initial oxide layer 206 is patterned to form the first oxide layer 206a over the first metal connect 204a and the second oxide layer 206d over the second metal connect 204b, as illustrated in FIG. 4. Turning to FIG. 2, prior to FIG. 4, the first metal connect 204a is adjacent the second metal connect 204b over the substrate 202, according to some embodiments. In some embodiments, the substrate 202 comprises at least one of silicon or germanium. According to some embodiments, the substrate 202 comprises at least one of an epitaxial layer, a silicon-on-insulator (SOI) structure, a wafer, or a die formed from a wafer. In some embodiments, the substrate 202 comprises at least one CMOS device. In some embodiments, at least one of the first metal connect 204a or the second metal connect 204b comprises at least one of aluminum or copper. In some embodiments, at least one of the first metal connect 204a or the second metal connect 204b has a metal layer thickness between about 2 Å to about 16 Å. In some embodiments, an initial oxide layer 206 is formed over the first metal connect 204a and the second metal connect 204b, as illustrated in FIG. 3. In some embodiments, the initial oxide layer 206 comprises oxide. In some embodiments, the initial oxide layer 206 is formed by deposition. In some embodiments, the initial oxide layer 206 has an initial oxide thickness between about 1800 Å to about 2400 Å. In some embodiments, the initial oxide layer 206 is patterned to form the first oxide layer 206a, the second oxide layer 206d, a first bump layer 206b and a second bump layer 206c, the first bump layer 206b between the first oxide layer 206a and the second bump layer 206c on the substrate 202 and the second bump layer 206c between the second oxide layer 206d and the first bump layer 206b on the substrate 202. In some embodiments, at least one of the first oxide layer 206a or the second oxide layer 206d has an oxide layer thickness between about 1200 Å to about 1800 Å. In some embodiments, at least one of the first bump layer 206b or the second bump layer 206c has a bump layer thickness between about 5 Å to about 50 Å.

At 104, a first opening 208a is formed through the first oxide layer 206a over the first metal connect 204a and a second opening 208b is formed through the second oxide layer 206d over the second metal connect 204b, as illustrated in FIG. 4, according to some embodiments. In some embodiments, the first opening 208a exposes the top surface 205a of the first metal connect 204a and the second opening 208b exposes the top surface 205b of the second metal connect 204b. In some embodiments, at least one of the first opening 208a or the second opening 208b are formed by etching.

Figure 5:
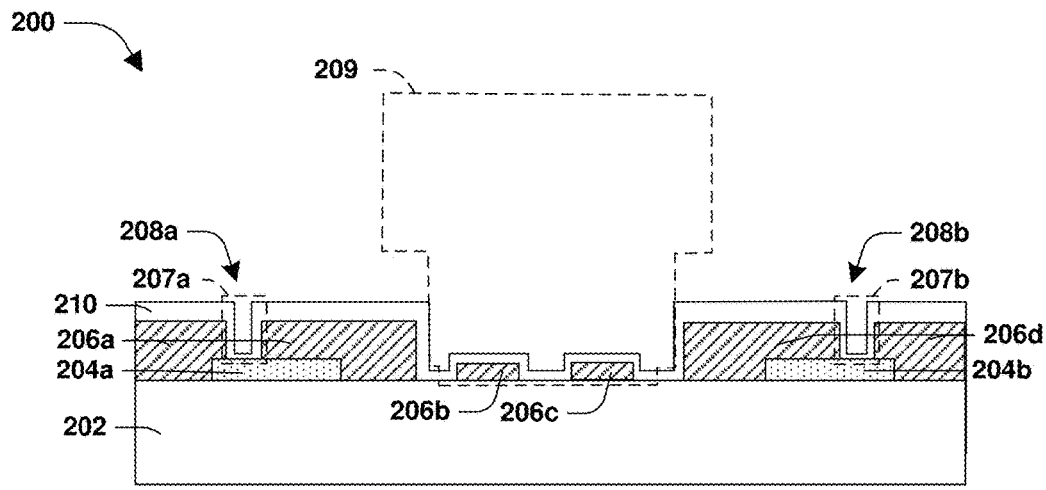
FIG. 5 is an illustration of a semiconductor arrangement, in accordance with some embodiments.

At 106, an initial metal layer 210 is formed over the first oxide layer 206a, the second oxide layer 206d, the first opening 208a, and the second opening 208b, as illustrated in FIG. 5, according to some embodiments. In some embodiments, the initial metal layer 210 is formed over the substrate 202, the first bump layer 206b and the second bump layer 206c in the MEMS area 209. In some embodiments, the initial metal layer 210 is formed by deposition. In some embodiments, the initial metal layer 210 is formed conformally to the first oxide layer 206a, the second oxide layer 206d, the first opening 208a, the second opening 208b, the substrate 202, the first bump layer 206b and the second bump layer 206c. In some embodiments, the initial metal layer 210 comprises titanium. In some embodiments, the initial metal layer 210 has a metal layer thickness between about 100 Å to about 7,000 Å.

Figure 6:
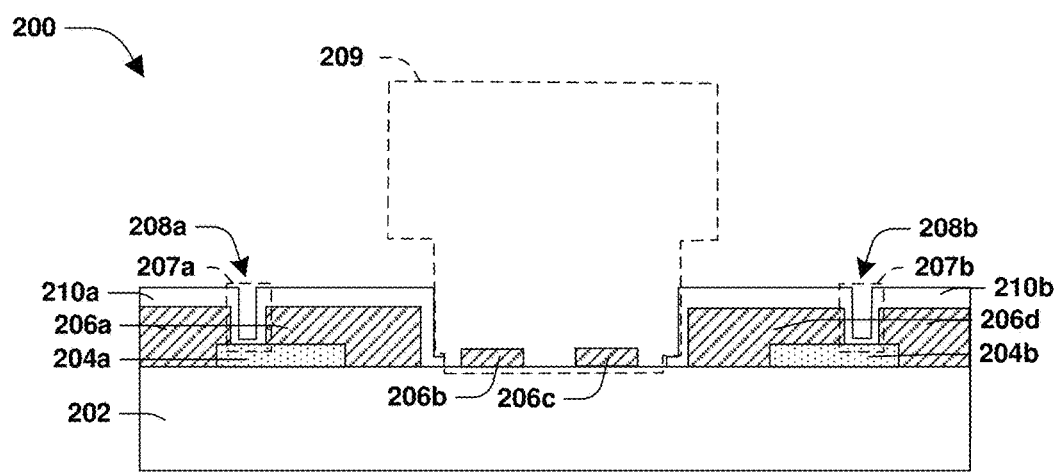
FIG. 6 is an illustration of a semiconductor arrangement, in accordance with some embodiments.

At 108, a portion of the initial metal layer 210 is removed from the MEMS area 209, such that the first metal layer 210a is formed over the first oxide layer 206a and the second metal layer 210b is formed over the second oxide layer 206d, as illustrated in FIG. 6, according to some embodiments. In some embodiments, the portion of the initial metal layer 210 is removed by etching. In some embodiments, removing the portion of the initial metal layer 210 exposes the first bump layer 206b and the second bump layer 206c and the substrate 202 in the MEMS area 209. In some embodiments, the first metal layer 210a has a first metal thickness between about 100 Å to about 7,000 Å. In some embodiments, the second metal layer 210b has a second metal thickness between about 100 Å to about 7,000 Å. In some embodiments, the portion 207a of the first metal layer is in contact with the top surface 205a of the first metal connect 204a. In some embodiments, the portion 207b of the second metal layer is in contact with the top surface 205b of the second metal connect 204b.

At 110, a wafer 203 comprising a MEMS device 203c is bonded over the first metal layer 210a and the second metal layer 210b, as illustrated in FIG. 7, according to some embodiments. In some embodiments, the wafer 203 comprises at least one of an epitaxial layer, a silicon-on-insulator (SOI) structure, a wafer, or a die formed from a wafer. In some embodiments, the wafer 203 comprises silicon. In some embodiments, the wafer 203 is bonded to the first metal layer 210a and the second metal layer 210b by a titanium-silicon wafer bond. In some embodiments, a first vacancy is formed between a top surface 211a of the portion 207a of the first metal layer 210a and a first wafer portion bottom surface 213a of the first wafer portion 203a. In some embodiments, a second vacancy is formed between a top surface 211b of the portion 207b of the second metal layer 210b and a second wafer portion bottom surface 213b of the second wafer portion 203b. In some embodiments, an initial metal pad comprising at least one of aluminum or copper is formed over the wafer 203. In some embodiments, the initial metal pad is patterned to form the first metal pad 212a, the first bonding pad 212b, a first squish prevention node 212c, a second squish prevention node 212d, the second bonding pad 212e and the second metal pad 212f. In some embodiments, the first metal pad 212a and the first bonding pad 212b are on a first side 216a of the MEMS device 203c outside the MEMS area 209, such that that the first bonding pad 212b is between the first squish prevention node 212c and the first metal pad 212a. In some embodiments, the second metal pad 212f and the second bonding pad 212e are on a second side 216b of the MEMS device 203c outside the MEMS area 209, such that that the second bonding pad 212e is between the second squish prevention node 212d and the second metal pad 212f. In some embodiments, the first squish prevention node 212c and the second squish prevention node 212d are in the MEMS area 209. In some embodiments, the first glue pad 222a comprising at least one of titanium or nitride is formed over the first metal pad 212a to form the first I/O port 224a. In some embodiments, the second glue pad 222b comprising at least one of titanium or nitride is formed over the second metal pad 212f to form the second I/O port 224b. In some embodiments, at least one of the first metal routing (not shown) connects the first metal connect 204a via the first metal layer 210a to the first I/O port 224a or the second metal routing (not shown) connects the second metal connect 204b via the second metal layer 210b to the second I/O port 224b. In some embodiments, at least one of the first I/O port 224a or the second I/O port 224b comprises an input port for the semiconductor arrangement 200. In some embodiments, at least one of the first I/O port 224a or the second I/O port 224b comprises an output port for the semiconductor arrangement 200.

At 112, a first MEMS opening 214a is formed on the first side 216a of the MEMS device 203c to form the first wafer portion 203a on the first side 216a of the MEMS device 203c and a second MEMS opening 214b is formed on the second side 216b of the MEMS device 203c to form the second wafer portion 203b on the second side 216b of the MEMS device 203c, as illustrated in FIG. 8, according to some embodiments. In some embodiments, a first squish prevention opening 226a is formed in the MEMS area 209 between the first squish prevention node 212c and the first bonding pad 212b, to form a first squish prevention region 228a comprising the first squish prevention node 212c and the first squish prevention opening 226a. In some embodiments, a second squish prevention opening 226b is formed in the MEMS area 209 between the second squish prevention node 212d and the second bonding pad 212e, to form a second squish prevention region 228b comprising the second squish prevention node 212d and the second squish prevention opening 226b. In some embodiments, at least one of the first MEMS opening 214a, the second MEMS opening 214b, the first squish prevention opening 226a or the second squish prevention opening 226b are formed by etching. In some embodiments, the MEMS device 203c is separated from the first wafer portion 203a and the second wafer portion 203b by the first MEMS opening 214a and the second MEMS opening 214b, such that the first MEMS opening 214a and the second MEMS opening 214b go through the wafer 203. In some embodiments, the MEMS device 203c is attached to an anchor (not shown), such that the MEMS device 203c does not fall when the first MEMS opening 214a and the second MEMS opening 214b are formed.

At 114, the cap 218 is connected over the top surface 225a of the first wafer portion 203a and over the top surface 225b of the second wafer portion 203b, as illustrated in FIG. 9, according to some embodiments. In some embodiments, the cap 218 comprises silicon. In some embodiments, the cap 218 is connected to the top surface 225a of the first wafer portion 203a by the first bond and connected to the top surface 225b of the second wafer portion 203b by the second bond. In some embodiments, the first bond comprises the first eutectic bond between the first bonding pad 212b and the first cap bonding pad 220a of the cap 218. In some embodiments, the first bonding pad 212b is on the top surface 225a of the first wafer portion 203a and comprises at least one of aluminum or copper. In some embodiments, the first cap bonding pad 220a comprises germanium. In some embodiments, the second bond comprises the second eutectic bond between the second bonding pad 212e and the second cap bonding pad 220b of the cap 218. In some embodiments, the second bonding pad 212e is on the top surface 225b of the second wafer portion 203b and comprises at least one of aluminum or copper. In some embodiments, the second cap bonding pad 220b comprises germanium. In some embodiments, some of the first bonding pad 212b will squish toward the first squish prevention region 226a during the formation of the first eutectic bond. In some embodiments, the first squish prevention region 226a prevents the squished first bonding pad 212b material from migrating to the substrate 202. In some embodiments, some of the second bonding pad 212e will squish toward the second squish prevention region 228b during the formation of the second eutectic bond. In some embodiments, the second squish prevention region 228b prevents the squished second bonding pad 212e material from migrating to the substrate 202. In some embodiments, at least one of the first eutectic bond is between at least one of germanium, aluminum or copper or the second eutectic bond is between at least one of germanium, aluminum or copper. In some embodiments, the cap 218 is vacuum sealed, such that there is little to no air in the MEMS area 209. In some embodiments, the semiconductor arrangement 200 comprises at least one of a motion sensor, a pressure sensor, a radio sensor, or an accelerometer. In some embodiments, the bond between the first metal layer 210a and the first wafer portion 203a requires between about 5% to about 10% less bonding area than a bond that is not between a first metal layer and a first wafer portion. In some embodiments, the first metal layer 210a and the second metal layer 210b increase the conductivity of the semiconductor arrangement 200, as compared to an arrangement that lacks at least one of a first metal layer or a second metal layer. In some embodiments, the semiconductor arrangement 200 comprising the first metal layer 210a connecting via a first metal routing the first metal connect 204a to the first I/O port 224a requires less processing than a device that requires a dopant implant to connect a first metal connect to a first I/O port. Further, a semiconductor device that does not require a dopant implant to connect a first metal connect to a first I/O port has at least one of an enhanced first bond or an enhanced second bond and thus a greater vacuum seal, due to a reduction in outgassing as compared to a semiconductor arrangement that requires the dopant implant.

According to some embodiments, a semiconductor arrangement comprises a first metal connect adjacent a second metal connect, the first metal connect and the second metal connect over a substrate and a first metal layer is over the first metal connect such that a portion of the first metal layer is in contact with a top surface of the first metal connect. In some embodiments, a second metal layer is over the second metal connect such that a portion of the second metal layer is in contact with a top surface of the second metal connect. In some embodiments, a micro electromechanical system (MEMS) area is between the first metal layer and the second metal layer, the MEMS area comprising a MEMS device. In some embodiments, a first wafer portion is bonded to the first metal layer over the first metal connect and a second wafer portion is bonded to the second metal layer over the second metal connect. In some embodiments, a cap is connected to a top surface of the first wafer portion by a first bond and connected to a top surface of the second wafer portion by a second bond, such that the cap goes over the MEMS area.

According to some embodiments, a method of forming a semiconductor arrangement comprises patterning an initial oxide layer to form a first oxide layer over a first metal connect and a second oxide layer over a second metal connect, where the first metal connect is adjacent the second metal connect on a substrate. According to some embodiments, the method of forming a semiconductor arrangement further comprises forming a first opening through the first oxide layer over the first metal connect, such that a top surface of the first metal connect is exposed and forming a second opening through the second oxide layer over the second metal connect, such that a top surface of the second metal connect is exposed. According to some embodiments, the method of forming a semiconductor arrangement further comprises forming an initial metal layer conformally over the first oxide layer, the second oxide layer, the first opening, the second opening and a micro electro-mechanical system (MEMS) area between the first oxide layer and the second oxide layer, such that a portion of a first metal layer of the initial metal layer is in contact with the top surface of the first metal connect and a portion of a second metal layer of the initial metal layer is in contact with the top surface of the second metal connect. According to some embodiments, the method of forming a semiconductor arrangement further comprises removing a portion of the initial metal layer from the MEMS area such that the first metal layer of the initial metal layer is formed over the first oxide layer and the second metal layer of the initial metal layer is formed over the second oxide layer and bonding a wafer comprising a MEMS device of the MEMS area over the first metal layer and the second metal layer.

According to some embodiments, a semiconductor arrangement comprises a first metal connect adjacent a second metal connect, the first metal connect and the second metal connect over a substrate, a first metal layer over the first metal connect such that a portion of the first metal layer is in contact with a top surface of the first metal connect. In some embodiments, a first oxide layer is between the first metal connect and the first metal layer and a second metal layer is over the second metal connect such that a portion of the second metal layer is in contact with a top surface of the second metal connect. In some embodiments, a second oxide layer is between the second metal connect and the second metal layer. In some embodiments, a micro electro-mechanical system (MEMS) area is between the first metal layer and the second metal layer, the MEMS area comprising a MEMS device. In some embodiments, a first wafer portion is bonded to the first metal layer over the first metal connect and a second wafer portion is bonded to the second metal layer over the second metal connect. In some embodiments, a cap is connected to a top surface of the first wafer portion by a first bond and connected to a top surface of the second wafer portion by a second bond, such that the cap goes over the MEMS area.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method of forming a semiconductor arrangement, comprising:
   patterning an oxide layer to form a first oxide structure over a first metal connect and a second oxide structure over a second metal connect;
   forming a first opening through the first oxide structure to expose a top surface of the first metal connect and a second opening through the second oxide structure to expose a top surface of the second metal connect;
   forming a metal layer over the first oxide structure, over the second oxide structure, in the first opening, in the second opening, and in a micro electro-mechanical system (MEMS) area between the first oxide structure and the second oxide structure, wherein:
      the metal layer is in contact with the top surface of the first metal connect through the first opening, and
      the metal layer is in contact with the top surface of the second metal connect through the second opening;
   removing the metal layer from the MEMS area to expose a layer underlying the first oxide structure and the second oxide structure; and
   bonding a wafer comprising a MEMS device over the metal layer such that the MEMS device is disposed in the MEMS area.

2. The method of claim 1, comprising:
   forming a third opening through the wafer on a first side of the MEMS device and a fourth opening through the wafer on a second side of the MEMS device after bonding the wafer over the metal layer.

3. The method of claim 2, comprising:
   connecting a cap over the wafer from the first side of the MEMS device to the second side of the MEMS device after forming the third opening and the fourth opening.

4. The method of claim 3, comprising:
   forming an input/output (I/O) port on a top surface of the wafer that is not covered by the cap such that the I/O port is disposed on an opposite side of the wafer relative to the metal layer.

5. The method of claim 3, comprising:
   forming a first squish prevention node over the wafer and between the cap and the third opening after bonding the wafer over the metal layer.

6. The method of claim 3, wherein connecting the cap comprises:
   forming a first eutectic bond between the cap and a metal pad disposed over the wafer.

7. The method of claim 1, wherein a vacancy is defined between the metal layer and the wafer in the first opening after bonding the wafer over the metal layer.

8. A method of forming a semiconductor arrangement comprising:
   forming an oxide layer over a first metal connect and a second metal connect disposed on a substrate;
   patterning the oxide layer to form a first oxide structure over the first metal connect and a second oxide structure over the second metal connect;
   forming a first metal layer over the first oxide structure and the second oxide structure, adjacent a sidewall of the first oxide structure, and contacting the substrate; and
   bonding a wafer comprising a MEMS device over the first metal layer, wherein the MEMS device is disposed within a MEMS area between the first oxide structure and the second oxide structure.

9. The method of claim 8, wherein patterning the oxide layer comprises:
   patterning the oxide layer to define an opening through the first oxide structure to expose the first metal connect.

10. The method of claim 9, wherein forming the first metal layer comprises:
    forming the first metal layer in the opening to contact the first metal connect.

11. The method of claim 8, wherein patterning the oxide layer comprises:
    patterning the oxide layer to define a first bump structure within the MEMS area.

12. The method of claim 11, wherein forming the first metal layer comprises:
    forming the first metal layer over the first bump structure.

13. The method of claim 12, comprising:
    removing the first metal layer in the MEMS area to expose the first bump structure and a portion of the substrate underlying the MEMS area.

14. The method of claim 8, wherein:
    the first metal layer comprises titanium,
    the wafer comprises silicon, and
    bonding the wafer over the first metal layer comprises bonding the wafer to the first metal layer through a titanium-silicon bond.

15. The method of claim 8, comprising:
    forming a second metal layer over the wafer; and
    patterning the second metal layer to define a bonding pad overlying the first oxide structure and a squish prevention node between the bonding pad and the MEMS device.

16. The method of claim 15, comprising:
    etching the wafer to define a squish prevention opening between the bonding pad and the squish prevention node.

17. The method of claim 15, comprising:
    connecting a cap extending over the MEMS area to the bonding pad.

18. The method of claim 17, wherein:
    the bonding pad comprises at least one of aluminum or copper,
    the cap comprises a cap bonding pad comprising germanium, and
    connecting the cap to the bonding pad comprises forming a eutectic bond between the at least one of aluminum or copper of the bonding pad and the germanium of the cap bonding pad.

19. A method of forming a semiconductor arrangement comprising:
    forming an oxide layer over a first metal connect and a second metal connect disposed on a substrate;
    patterning the oxide layer to form a first opening exposing the first metal connect and a second opening exposing the second metal connect;
    forming a first metal layer in the first opening, in the second opening, and over the oxide layer;
    bonding a wafer comprising a MEMS device to the first metal layer;
    forming a second metal layer over the wafer; and
    patterning the second metal layer to define a bonding pad and a squish prevention node between the bonding pad and the MEMS device.

20. The method of claim 19, comprising:

connecting a cap to the bonding pad, wherein the cap extends over the MEMS device to cover the MEMS device.

* * * * *